(12) United States Patent
Mukherjee et al.

(10) Patent No.: US 11,844,188 B2
(45) Date of Patent: Dec. 12, 2023

(54) DISTRIBUTION OF AVAILABLE POWER TO DEVICES IN A GROUP

(71) Applicant: Dell Products, L.P., Round Rock, TX (US)

(72) Inventors: Rishi Mukherjee, Bangalore (IN); Sivakumar Swamy, Bangalore (IN); Sandeep Venkatesh Pai, Bangalore (IN); Shivendra Katiyar, Bangalore (IN); Harshendra Shetty, Bangalore (IN)

(73) Assignee: Dell Products, L.P., Round Rock, TX (US)

( * ) Notice: Subject to any disclaimer, the term of this patent is extended or adjusted under 35 U.S.C. 154(b) by 59 days.

(21) Appl. No.: 17/644,020

(22) Filed: Dec. 13, 2021

(65) Prior Publication Data

US 2023/0189469 A1 Jun. 15, 2023

(51) Int. Cl.
  G06F 1/32 (2019.01)
  H05K 7/14 (2006.01)
  G06F 1/3206 (2019.01)
  G06F 1/18 (2006.01)

(52) U.S. Cl.
  CPC .......... H05K 7/1492 (2013.01); G06F 1/189 (2013.01); G06F 1/3206 (2013.01)

(58) Field of Classification Search
  None
  See application file for complete search history.

(56) References Cited

U.S. PATENT DOCUMENTS

| 2008/0222435 | A1* | 9/2008 | Bolan | G06F 1/3203 713/310 |
| 2009/0055665 | A1* | 2/2009 | Maglione | G06F 1/206 713/320 |
| 2012/0137158 | A1* | 5/2012 | Nelluri | H05K 7/1498 713/340 |
| 2013/0226362 | A1* | 8/2013 | Jagadishprasad | G06F 1/3203 700/297 |

(Continued)

OTHER PUBLICATIONS

"Support for Dell EMC OpenManage Enterprise Power Manager," https://www.dell.com/support/kbdoc/en-us/000176254/support-for-dell-emc-openmanage-enterprise-power-manager-and-power-center, Dell Technologies, accessed Dec. 13, 2021, 16 pages.

(Continued)

*Primary Examiner* — Danny Chan
(74) *Attorney, Agent, or Firm* — Amin, Turocy & Watson, LLP

(57) ABSTRACT

The described technology is generally directed towards a system and method to distribute available power to devices in a group. A group of devices, such as a rack of servers in a data center, can have a group power consumption limit, such as the limit of a power distribution unit that supplies power to the group. The group of devices can each report their individual power consumption to a manager, and the manager can combine the individual power consumptions. The manager can compare the combined power consumption of the group to the group power consumption limit to determine a power headroom. The manager can determine power consumption limits for the devices of the group based on the power headroom, the individual power consumptions, and device priority information.

20 Claims, 10 Drawing Sheets

(56) References Cited

U.S. PATENT DOCUMENTS

2013/0318371 A1* 11/2013 Hormuth ............. G06F 11/3062
713/320
2015/0026495 A1* 1/2015 Jain .......................... G06F 1/32
713/323
2019/0377395 A1* 12/2019 Kaburlasos ........... G06F 1/3206

OTHER PUBLICATIONS

"Dell EMC OpenManage Power Center 4.1," User's Guide, Sep. 2018, Rev. A00, 119 pages.

Mukherjee, et al. "Reallocation of Available Power Among Devices in a Group" U.S. Appl. No. 17/581,388, filed Jan. 21, 2022, 54 pages.

* cited by examiner

|  | Interval 1 | | Interval 2 | | Interval 3 | |
| --- | --- | --- | --- | --- | --- | --- |
|  | Limit 1 | IPC 1 | Limit 2 | IPC 2 | Limit 3 | IPC 3 |
| Device 1 |  | 250W | 409W | 400W | 473W | 473W |
| Device 2 |  | 350W | 573W | 500W | 591W | 591W |
| Device 3 |  | 300W | 453W | 427W | 501W | 501W |
| Device 4 |  | 200W | 302W | 200W | 235W | 235W |
| Device 5 |  | 200W | 263W | 173W | 200W | 200W |
| Group |  | 1300W | 2000W | 1700W | 2000W | 2000W |
| Headroom |  | 700W | 0W | 300W | 0W | 0W |

FIG. 5

DISTRIBUTION OF AVAILABLE POWER TO DEVICES IN A GROUP

BACKGROUND

Data centers are power hungry. Often available power is less than the maximum combined power needs of all devices in the data center. Furthermore, there can be significant financial penalties for exceeding available power. To address this, data center administrators resort to capping the power consumed by individual devices to stay within available power.

Furthermore, a rack of server devices in a data center is typically connected to a single power distribution unit (PDU) which supplies power to the rack. Exceeding the power limit of a PDU can cause the PDU to fail, which can cut power to the rack. Data center administrators therefore also cap individual device power consumption to keep the power consumption of a rack within the power limit of its PDU.

However, static capping of individual device power consumption can lead to underutilization of power and reduced performance of applications running in data centers. Due to changes in workload(s), the power demand of each individual device can vary greatly. Static capping on an individual device basis may not be the best policy as it does not allow a device's power allocation to grow when power is available, resulting in artificial restriction of device performance.

The above-described background is merely intended to provide a contextual overview of some current issues and is not intended to be exhaustive. Other contextual information may become further apparent upon review of the following detailed description.

BRIEF DESCRIPTION OF THE DRAWINGS

The technology described herein is illustrated by way of example and not limited in the accompanying figures in which like reference numerals indicate similar elements and in which:

FIG. 5 is a table showing example individual power consumptions of devices at different time intervals, and example power limits assigned to the devices for the time intervals, wherein the power limits can be based on the individual power consumptions and other data, in accordance with one or more embodiments described herein.

DETAILED DESCRIPTION

Figure 1:
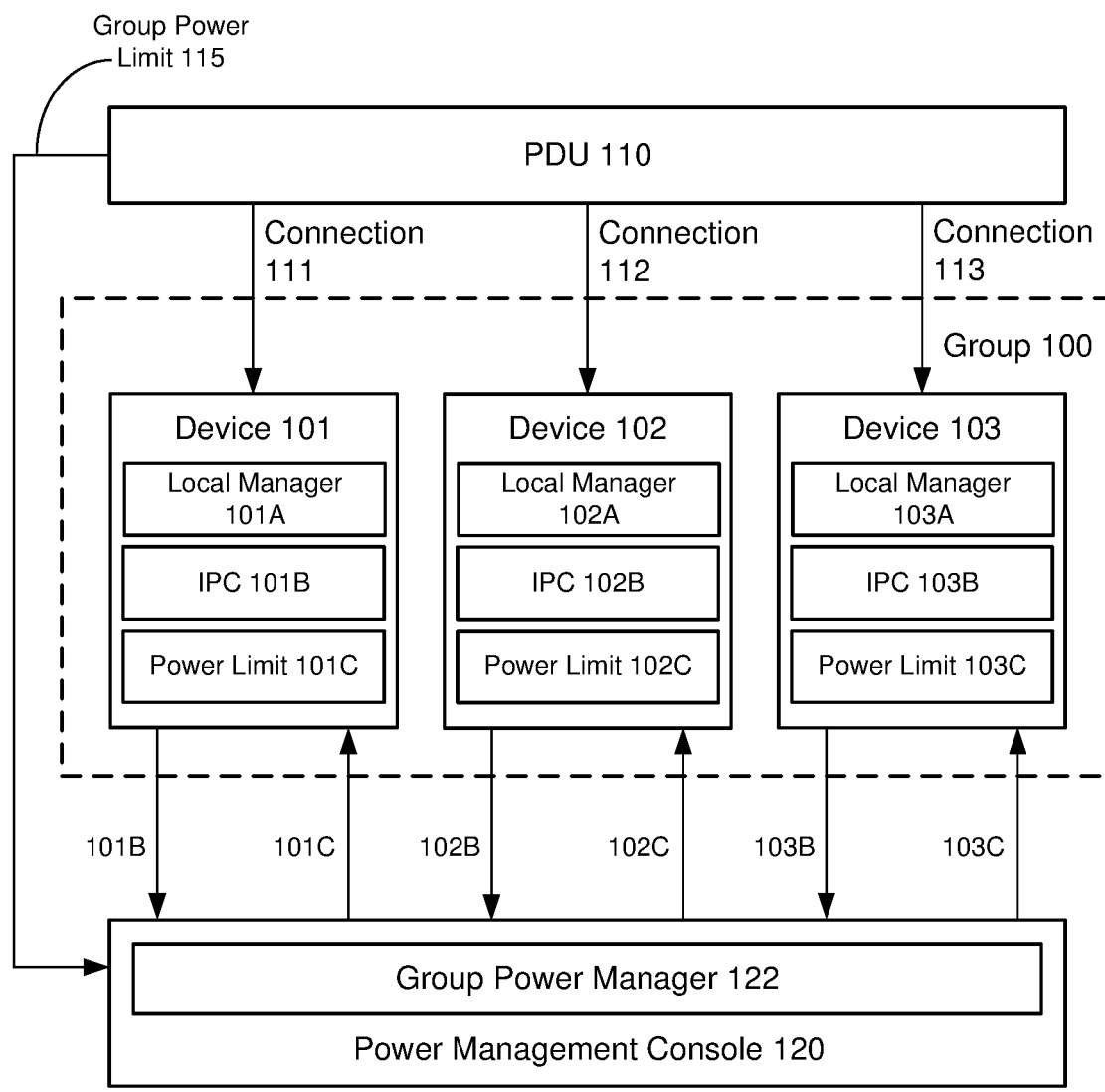
FIG. 1 illustrates an example group of devices and a power management console configured to manage power consumption of the devices, in accordance with one or more embodiments described herein.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular networked environment or standard. In other instances, well-known structures and devices are shown in block diagram form in order to facilitate describing the embodiments in additional detail.

Example embodiments are directed to a system and method to distribute available power to devices in a group. A group of devices, such as a rack of servers in a data center, can have a group power consumption limit, such as the limit of a power distribution unit that supplies power to the group. The group of devices can each report their individual power consumption to a manager, and the manager can combine the individual power consumptions. The manager can compare the combined power consumption of the group to the group power consumption limit to determine a power headroom. The manager can determine power consumption limits for the devices of the group based on the power headroom, the individual power consumptions, and device priority information.

As used in this disclosure, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component can be, but is not limited to being, a process running on a processor, a processor, an object, an executable, a thread of execution, computer-executable instructions, a program, and/or a computer. By way of illustration and not limitation, both an application running on a server and the server can be a component.

One or more components can reside within a process and/or thread of execution and a component can be localized on one computer and/or distributed between two or more computers. In addition, these components can execute from various computer readable media having various data structures stored thereon. The components can communicate via local and/or remote processes such as in accordance with a signal having one or more data packets (e.g., data from one component interacting with another component in a local system, distributed system, and/or across a network such as the internet with other systems via the signal). As another example, a component can be an apparatus with specific functionality provided by mechanical parts operated by electric or electronic circuitry, which is operated by a software application or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

The term "facilitate" as used herein is in the context of a system, device or component "facilitating" one or more actions or operations, in respect of the nature of complex computing environments in which multiple components and/or multiple devices can be involved in some computing operations. Non-limiting examples of actions that may or may not involve multiple components and/or multiple devices comprise transmitting or receiving data, establishing a connection between devices, determining intermediate results toward obtaining a result, etc. In this regard, a computing device or component can facilitate an operation by playing any part in accomplishing the operation. When operations of a component are described herein, it is thus to be understood that where the operations are described as facilitated by the component, the operations can be optionally completed with the cooperation of one or more other computing devices or components, such as, but not limited to, sensors, antennae, audio and/or visual output devices, other devices, etc.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable (or machine-readable) device or computer-readable (or machine-readable) storage/communications media. For example, computer readable storage media can comprise, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

The subject application generally relates to managing device power consumption, such as the power consumption of computing devices in data centers.

FIG. 1 illustrates an example group of devices and a power management console configured to manage power consumption of the devices, in accordance with one or more embodiments described herein. FIG. 1 includes power distribution unit (PDU) 110, group 100, and power management console 120. The group 100 includes device 101, device 102, and device 103. Device 101 includes local manager 101A, individual power consumption (IPC) 101B, and power limit 101C. Device 102 includes local manager 102A, individual power consumption (IPC) 102B, and power limit 102C. Device 103 includes local manager 103A, individual power consumption (IPC) 103B, and power limit 103C. The power management console 120 includes a group power manager 122.

In an example according to FIG. 1, the local managers 101A, 102A, 103A at the devices 101, 102, 103 can be configured to report IPCs 101B, 102B, 103B to the group power manager 122. The group power manager 122 can be configured to use the IPCs 101B, 102B, 103B, the group power limit 115, and optionally additional information as described herein, to determine power limits 101C, 102C, 103C for the devices 101, 102, 103. The group power manager 122 can provide the power limits 101C, 102C, 103C to the devices 101, 102, 103, and the local managers 101A, 102A, 103A can enforce the power limits 101C, 102C, 103C at the devices 101, 102, 103.

The reporting of IPCs 101B, 102B, 103B by the devices 101, 102, 103, and the calculation of power limits 101C, 102C, 103C by the group power manager 122 can be performed repetitively on an ongoing basis, so that new power limits 101C, 102C, 103C are intermittently re-established for the devices 101, 102, 103 based on updated IPCs 101B, 102B, 103B and any other updated information used by the group power manager 122 to calculate the power limits 101C, 102C, 103C.

In an example embodiment, the devices 101, 102, 103 can comprise server computing devices, such as blade servers that are physically located in a rack of servers within a data center. The group 100 can include, e.g., up to all of the server devices in the rack. The local managers 101A, 102A, 103A can comprise "itrack" type local power management components, optionally modified to implement aspects of this disclosure. The PDU 110 can comprise a PDU that supplies power to the devices 101, 102, 103 of the group 100 via connections 111, 112, and 113. A maximum power output of the PDU 110 can be used as the group power limit 115. The power management console 120 can comprise a power management console (PMC) which is modified to include the group power manager 122 configured according to this disclosure.

In other example embodiments, the group 100 can include any logical or physical group of devices. The group 100 comprises three example devices 101, 102, 103, however other groups can include more or fewer devices. The devices 101, 102, 103 can all be a same type of device, such as a server device, or the devices 101, 102, 103 can comprise devices of different types. The group power limit 115 need not be a limit associated with the PDU 100, but can instead comprise, e.g. a legally or voluntarily imposed group power limit, or a limit associated with a different component other than the PDU 110.

The group power limit 115 can be obtained by the power management console 120 for use by the group power manager 122. In some embodiments, the power management console 120 can optionally receive the group power limit 115 directly from the PDU 110, or group power limit 115 information can be manually supplied to the power management console 120, or the power management console 120 can calculate the group power limit 115 based on PDU 110 type information or measurements.

The IPCs 101B, 102B, 103B can also be obtained by the power management console 120 for use by the group power manager 122. In some embodiments, the respective local managers 101A, 102A, 103A can be configured to report respective IPCs 101B, 102B, 103B to the group power manager 122. Reporting IPCs 101B, 102B, 103B can optionally be in response to requests from the group power manager 122. Alternatively, IPCs 101B, 102B, 103B can be manually supplied to the power management console 120, IPCs 101B, 102B, 103B can be stored at a storage location accessible by the power management console 120, or the power management console 120 can calculate the IPCs 101B, 102B, 103B based on measurements at connections 111, 112, 113.

The IPCs 101B, 102B, 103B can comprise measurements of present power consumption by each of the devices 101, 102, and 103. For example, an IPC 101B can comprise an instantaneous "snapshot" of a present power consumption by device 101, or for example, an IPC 101B can comprise an average power consumption of a device 101 over a sliding time window which immediately precedes a present time. In some embodiments, the respective local managers 101A, 102A, and 103A can be configured to measure the respective IPCs 101B, 102B, 103B, or otherwise obtain IPC information at devices 101, 102, 103. The respective local managers 101A, 102A, and 103A can be configured to report the respective IPCs 101B, 102B, 103B to the group power manager 122. The reporting of IPCs 101B, 102B, 103B can take place at multiple different times, e.g., according to a periodic interval, or in response to requests from the group power manager 122, or both.

The group power manager 122 can optionally obtain, from devices 101, 102, 103, additional information (in addition to IPCs 101B, 102B, 103B) for use in calculating power limits 101C, 102C, 103C for the devices 101, 102, 103. For example, the group power manager 122 can optionally obtain device priority class information from each of the devices 101, 102, 103, and the priority class information can be used in connection with determining power limits 101C, 102C, 103C, in accordance with the teachings herein. Device priority class information can optionally be reported to the group power manager 122 by devices 101, 102, 103 along with the IPCs 101B, 102B, 103B, or device priority class information can be provided to the group power manager 122 manually or by any other channel as appropriate for particular embodiments.

The group power manager 122 can be configured to use IPCs 101B, 102B, 103B, the group power limit 115 and other information such as device priority class information, to determine respective power limits 101C, 102C, 103C for the respective devices. A detailed discussion of an example group power manager is provided in connection with FIG. 2.

The group power manager 122 can operate repetitively, e.g., at multiple different periodic or non-periodic time intervals, by obtaining, at each interval, updated IPCs 101B, 102B, 103B, and by recalculating power limits 101C, 102C, 103C based on the updated IPCs 101B, 102B, 103B. The group power manager 122 can provide updated power limits 101C, 102C, 103C to the devices 101, 102, 103 for enforcement of the updated power limits 101C, 102C, 103C at the devices 101, 102, 103.

The respective local managers 101A, 102A, 103A can be configured to receive respective power limits 101C, 102C, 103C from the group power manager 122, and to enforce the respective power limits 101C, 102C, 103C at the respective devices 101, 102, and 103.

Figure 2:
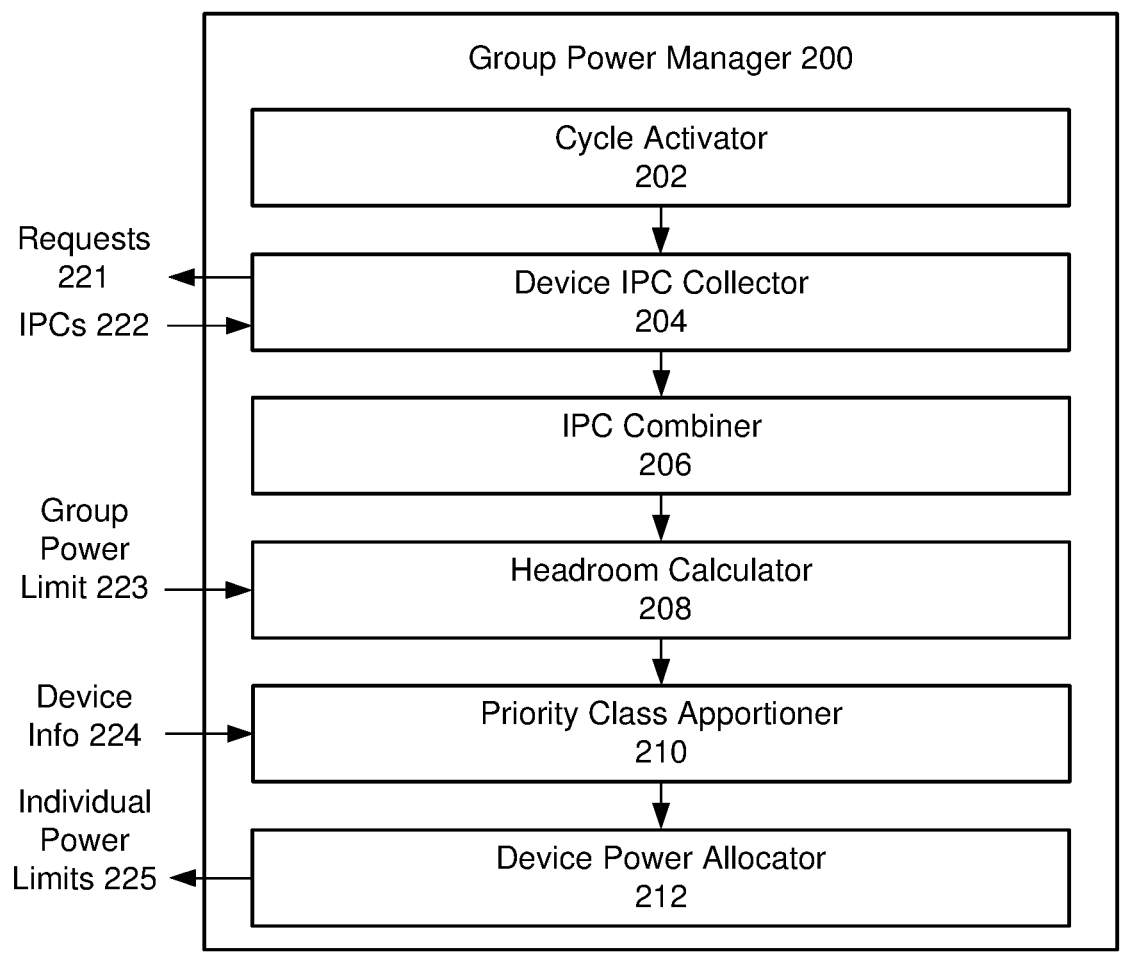
FIG. 2 illustrates an example group power manager which can be deployed in a power management console to manage power consumption of devices, in accordance with one or more embodiments described herein.

FIG. 2 illustrates an example group power manager which can be deployed in a power management console to manage power consumption of devices, in accordance with one or more embodiments described herein. The example group power manager 200 can implement the group power manager 122 introduced in FIG. 1. The group power manager 200 includes a cycle activator 202, a device IPC collector 204, an IPC combiner 206, a headroom calculator 208, a priority class apportioner 210, and a device power allocator 212.

Example operations according to FIG. 2 can include, e.g., periodically activating a cycle by cycle activator 202. Each cycle can include operations of each of device IPC collector 204, IPC combiner 206, headroom calculator 208, priority class apportioner 210, and device power allocator 212. The device IPC collector 204 can be configured to optionally send requests 221 to devices, e.g., the devices 101, 102, 103 illustrated in FIG. 1. The device IPC collector 204 can receive IPCs 222 in response to the requests 221. The IPCs 222 can include, e.g., IPCs 101B, 102B, 103B illustrated in FIG. 1. The IPC combiner 206 can combine the power consumption values included in IPCs 222, e.g., by adding the IPC values of all devices in a group 100. The IPC combiner 206 can thereby calculate a group power consumption of devices, e.g., 101, 102, 103, in a group 100.

The headroom calculator 208 can be configured to use a group power limit 223, e.g., the group power limit 115 introduced in FIG. 1, along with the group power consumption determined by the IPC combiner 206, to calculate a power headroom. For example, the headroom calculator 208 can subtract the group power consumption from the group power limit 223 in order to calculate power headroom as the difference between the group power consumption and the group power limit 223.

The priority class apportioner 210 can be configured to calculate portions of the power headroom determined by headroom calculator 208, wherein the portions are for assignment to different device priority classes. For example, device info 224 can include priority class assignments of each device 101, 102, 103 in a group 100. The priority class apportioner 210 can use priority class assignment information, optionally along with other information as described herein, to determine portions of the power headroom to be assigned to each priority class. Resulting calculated portions of the power headroom can optionally be used as adjustment values to adjust the total power portions available each priority class.

The device power allocator 212 can be configured to determine power allocations for each device 101, 102, 103. In an embodiment, the device power allocator 212 can allocate each respective portion determined by the priority class apportioner 201 to the devices in the respective priority class corresponding to the respective portion. Thus for example if devices 101 and 102 are in a first priority class, the device power allocator 212 can allocate the portion for the first priority class among devices 101 and 102. In some embodiments, the device power allocator 212 can use the IPCs of the devices to determine allocations among the devices in a priority class. The device power allocator 212 can determine individual power limits 225 based its allocations. The individual power limits 225 can comprise, e.g., the power limits 101C, 102C, 103C. The group power manager 200 can send the individual power limits 225 to the devices.

Unlike static power capping, dynamic capping according to this disclosure can adjust the capping values, i.e., the individual power limits 225, of each device in a group based on the power demand of the device and the total power available to the group. Dynamic capping's responsive distribution of power helps to minimize negative performance impacts due to power capping, while ensuring that overall power consumption of the group never exceeds available power.

Embodiments of this disclosure can overcome the limitations of static power capping by dynamically capping the power of devices based on a defined policy. The considerations in power capping policy can include: 1. Scope, i.e., the set of devices on which a policy is to be applied. This can range from all devices in a data center to devices in a specific rack to any arbitrary group of devices. 2. Device priority classes, i.e., the relative importance of devices in a group, which can influence the extent to which device power is capped. There can be multiple levels of priority. In one example, described further below, three levels of priority (High, Medium, Low) are considered. 3. Relative priority weights, i.e., weights used to configure a ratio of power distributed among the different priority classes. 4. Minimum power needed by devices, i.e. a lower bound of the device power consumption. 5. Maximum power consumed by a device, i.e., an upper bound of device power consumption. 6. Total available power, i.e., the group power limit 223 which defines the total power available for the scope of the policy. This should be equal to or greater than the sum of the minimum power needed by the devices.

Power management can be done based on power availability specified in a policy, which should not be less than the cumulative lower bounds of the applicable devices. Power management can use a nonintrusive method and can be based on a non-trivial weighted priority technique. Weighted priority can involve calculations that consider the varying degrees of importance of multiple classes of devices in a group.

At each sampling interval, power consumption data from each device can be collected. Available power headroom can be computed. Capping values of each device can be adjusted to allocate the available power considering the priority class of the device and its current consumption. The group power manager 200 can raise the power caps of individual devices that are busier and need more power, while lowering the caps for the devices that are consuming less power, and while also ensuring that the overall power consumption never goes above the total available power. This will balance the group capping and will optimize the use of power among the devices in the group.

In an example embodiment, the class apportioner 210 can apply the below calculation to determine portions of power for each priority class:

$$Vpc = \frac{(V*Pi*Wi)}{\Sigma_{i=1}^{N}(Pi*Wi)}$$

In the above example calculation, Vpc is the consolidated power cap to be allocated amongst devices within a given priority class pc. Vpc thus defines a portion of available power to be allocated amongst devices in a priority class. Vpc can be calculated as a function of V, Pi, Wi and N, wherein V is a power availability for the devices in a reactive dynamic power policy, that is, a power headroom for a reactive dynamic power policy; Pi is a population in a priority class i (in this example, a number of devices in the priority class i); Wi is a weighted priority for the priority class i, and N is the total number of priority classes. The weighted priority Wi can be a fixed value for each priority class, or can be adjusted if priorities change.

After determinations of the portions of power for each priority class, the device power allocator 212 can allocate the Vpc portions designated for each priority class among the devices within each priority class. The device power allocator 212 can perform a power cap adjustment amongst the devices within the same priority class based on individual device power consumption and the consolidated power caps Vpc. In an example embodiment, the device power allocator 212 can apply the below calculation to determine allocations of power to each device:

$$Vd = \frac{Vpc}{Tpc}*Cd$$

In the above example calculation, Vd is the power cap to be allocated to each device d, e.g., Vd is can be a power limit such as 101C, 102C, or 103C, illustrated in FIG. 1. Vd can be calculated as a function of Vpc, Tpc, and Cd, wherein Vpc is the consolidated power cap to be adjusted amongst devices within a priority class pc which includes the device d, Tpc is the total combined power consumption of the devices in priority class pc, and Cd is the power consumption of the device d, e.g., an IPC such as 101B, 102B, or 103B.

In some embodiments, the priority class apportioner 210 and device power allocator 212 can apply additional rules in order to make determinations regarding individual power limits 225. The additional rules can include, e.g., a rule that disallows an individual power limit to fall below a minimum power needed by a device, and adjusts individual power limits as needed to prevent such an occurrence; a rule that disallows an individual power limit to exceed a maximum power of a device; and a rule that specifies an action to take in the event of no available power headroom, for example, in such event devices can remain capped at current levels.

Furthermore, if a policy is updated to either change the weighted priorities of the priority classes, or, increase the group power limit resulting in additional power headroom, embodiments can be configured to responsively recalculate the individual power limits 225 according to the techniques described herein.

Figure 3:
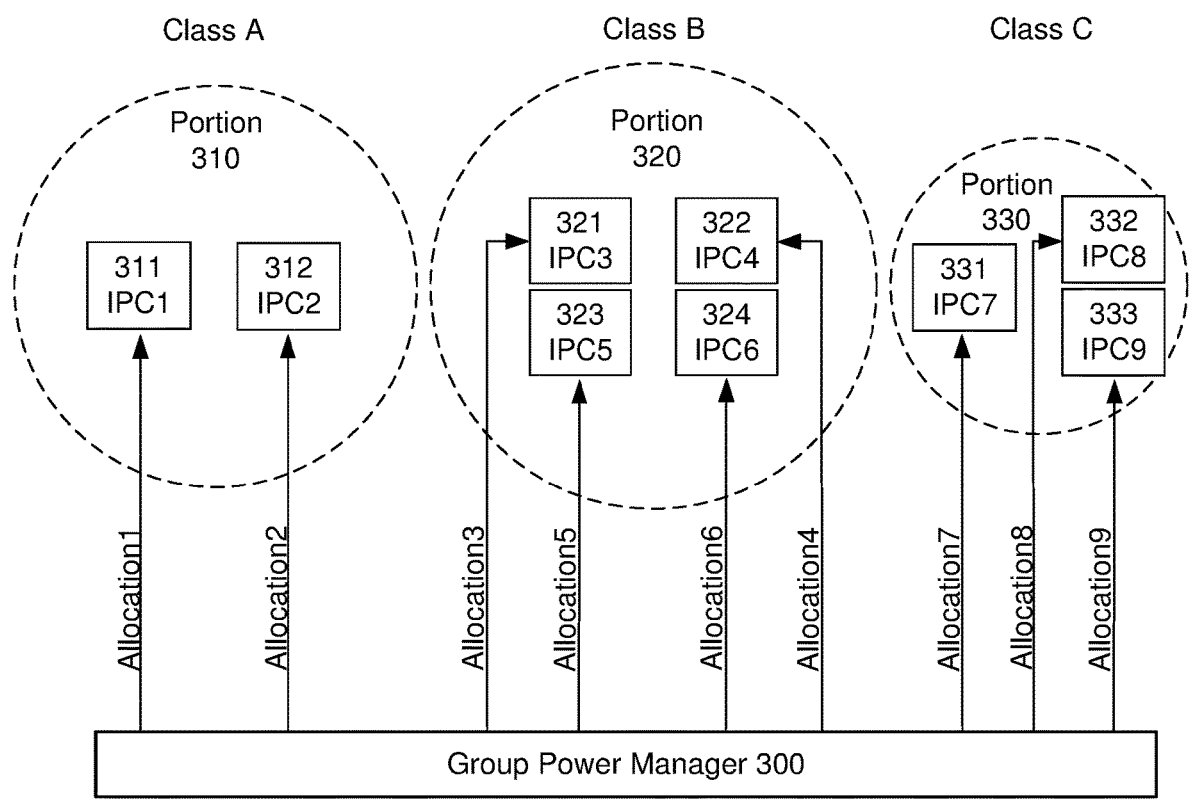
FIG. 3 illustrates example devices of different priority classes, portions of available power assigned to the different priority classes, and allocations of the portions of available power among the devices of the different priority classes, in accordance with one or more embodiments described herein.

FIG. 3 illustrates example devices of different priority classes, portions of available power assigned to the different priority classes, and allocations of the portions of available power among the devices of the different priority classes, in accordance with one or more embodiments described herein. FIG. 3 includes a group power manager 300, which can implement, e.g., the group power manager 200 introduced in FIG. 2, or the group power manager 122 introduced in FIG. 1.

FIG. 3 furthermore illustrates example devices, including devices 311, 312, 321, 322, 323, 324, 331, 332 and 333. The devices 311, 312, 321, 322, 323, 324, 331, 332 and 333 are each associated with an individual power consumption (IPC): device 311 is associated with IPC1, device 312 is associated with IPC2, device 321 is associated with IPC3, device 322 is associated with IPC4, device 323 is associated with IPC5, device 324 is associated with IPC6, device 331 is associated with IPC7, device 332 is associated with IPC8, and device 333 is associated with IPC9.

The devices 311, 312, 321, 322, 323, 324, 331, 332 and 333 can be included in a group of devices having power limits that are managed by the group power manager 300. The group power manager 300 can provide allocations to the devices 311, 312, 321, 322, 323, 324, 331, 332 and 333, wherein each allocation can designate a power limit to be applied at a device. In FIG. 3, the group power manager 300 provides allocation1 to device 311, allocation2 to device 312, allocation3 to device 321, allocation4 to device 322, allocation5 to device 325, allocation6 to device 324, allocation7 to device 331, allocation8 to device 332, and allocation9 to device 333.

The devices 311, 312, 321, 322, 323, 324, 331, 332 and 333 are divided into different priority classes, including class A, class B, and class C. Devices 311 and 312 are in class A, devices 321, 322, 323 and 324 are in class B, and devices 331, 332 and 333 are in class C.

In order to determine the allocations, the group power manager 300 can first determine portions for each priority class, and then allocate the portions among the devices in the priority class. For example, in FIG. 3, the group power manager 300 has determined portion 310 for class A, portion 320 for class B, and portion 330 for class C. The group power manager 300 has then allocated portion 310 among devices 311 and 312, allocated portion 320 among devices 321, 322, 323, and 324, and allocated portion 330 among devices 331, 332, and 333.

The determination of portions 310, 320, and 330 can be based on information such as the group power limit, the combined power consumption of devices 311, 312, 321, 322, 323, 324, 331, 332 and 333 (i.e. the sum of IPC1, IPC2, IPC3, IPC4, IPC5, IPC6, IPC7, IPC8, and IPC9), the power headroom (which can be calculated as the difference between the group power limit and the combined power consumption), the weighted priorities of the classes, the population in each class, and the number of classes, e.g., as described above with reference to FIG. 2.

The determination of the allocations within a portion, such allocation1 and allocation2, within portion 310, can be based on information such as the size of the portion 310, the total consumption of devices 311 and 312 within the priority class corresponding to the portion 310, and the individual power consumption IPC1 or IPC2 of a device for which the allocation (allocation1 or allocation2) is being determined, e.g., as described above with reference to FIG. 2.

Figure 4:
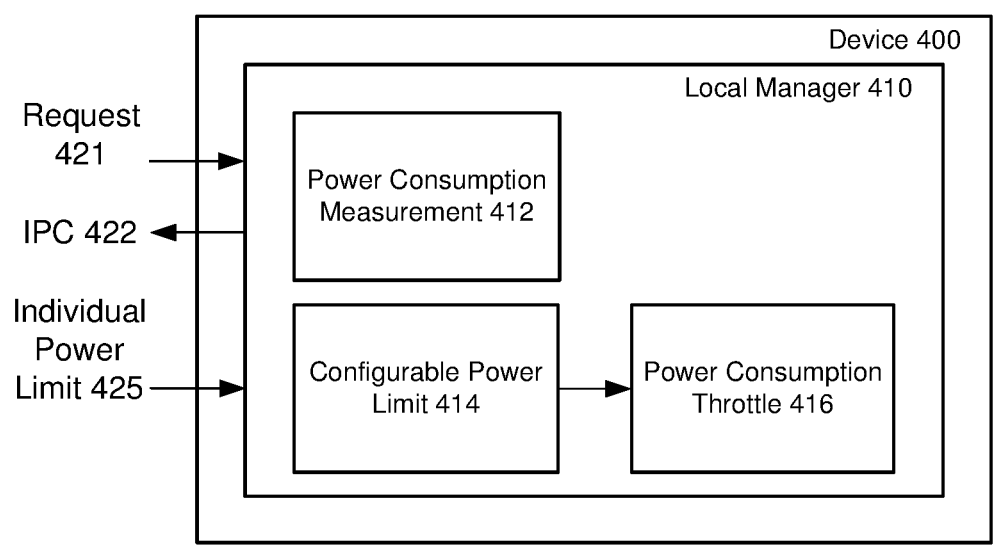
FIG. 4 illustrates an example device equipped with a local manager configured to report device power consumption and receive and enforce a configurable power limit for the device, in accordance with one or more embodiments described herein.

FIG. 4 illustrates an example device equipped with a local manager configured to report device power consumption and receive and enforce a configurable power limit for the device, in accordance with one or more embodiments described herein. The example device 400 can implement, e.g., any of devices 101, 102, or 103, illustrated in FIG. 1, or any of devices 311, 312, 321, 322, 323, 324, 331, 332 and 333 illustrated in FIG. 3. The device 400 includes a local manager 410. Local manager 410 can implement any of the local managers 101A, 102A, or 103A illustrated in FIG. 1. The local manager 410 includes power consumption measurement 412, configurable power limit 414, and power consumption throttle 416.

Example operations according to FIG. 4 can include receiving a request 421 at the local manager 410. The request 421 can include, e.g. a request among requests 221 introduced in FIG. 2. In response to the request 421, the local manager 410 can activate power consumption measurement 412 to measure the individual power consumption at the device 400, resulting in IPC 422. The local manager 410 can send IPC 422 for use by a group power manager to calculate a power limit, such as individual power limit 425, for the device 400. Upon receiving individual power limit 425, the local manager 410 can store use the individual power limit 425 as the limit for configurable power limit 414. The power consumption throttle 416 can be configured to throttle device 400 power consumption so as not to exceed the configurable power limit 414.

FIG. 5 is a table showing example individual power consumptions of devices at different time intervals, and example power limits assigned to the devices for the time intervals, wherein the power limits can be based on the individual power consumptions and other data, in accordance with one or more embodiments described herein. FIG. 5 includes a device 1 row, a device 2 row, a device 3 row, a device 4 row, a device 5 row, a group row, and a headroom row. FIG. 5 further includes an interval 1 column divided into a limit 1 column and an IPC1 column, an interval 2 column divided into a limit 2 column and an IPC2 column, and an interval 3 column divided into a limit 3 column and an IPC3 column.

In general, with reference to FIG. 5, a group power manager such as group power manager 122 can initially receive device IPC1 values, such as 250 Watts (W) for device 1, 350 W for device 2, 300 W for device 3, 200 W for device 4 and 200 W for device 5. The group power manager 122 can combine the device IPC1 values to calculate the combined power consumption for the group as 1300 W. Using an example group power limit of 2000 W, the group power manager 122 can determine the resulting power headroom is 700 W. The group power manager 122 can then determine individual power limits for the devices using the techniques described herein, resulting in the limit values in the limit 2 column. The group power manager 122 can provide the limit 2 values to the respective devices (devices 1-5), and the devices can continue to operate while restricting their power consumption based on their respective limit 2 power limits.

At some subsequent time, e.g., toward the end of interval 2, the group power manager 122 can receive device IPC2 values, such as 400 W for device 1, 500 W for device 2, 427 W for device 3, 200 W for device 4 and 173 W for device 5. The group power manager 122 can combine the device IPC2 values to calculate the combined power consumption for the group as 1700 W. The group power manager 122 can determine the resulting power headroom is 300 W. The group power manager 122 can then determine individual power limits for the devices using the techniques described herein, resulting in the limit values in the limit 3 column. The group power manager 122 can provide the limit 3 values to the respective devices, and the devices can continue to operate while restricting their power consumption based on their respective limit 3 power limits. At some subsequent time, e.g., toward the end of interval 3, the group power manager 122 can receive device IPC3 values, and the above described process can be repeated again and further repeated indefinitely as described above.

In an example embodiment, FIG. 5 demonstrates how power limits can be adjusted after each sampling interval. Power limits of each device can be calculated at each interval based on the power demand from the previous interval, and the power limits can be dynamically adjusted as needed. While adjusting the power limit (capping) values on each device, the group power manager 122 can maintain the total power consumption of the group within the group capping ceiling (here, 2000 W). If the combined power consumption reaches the budget group power limit, as in the IPC3 column, the group power manager 122 can optionally retain the power limits from the previous interval.

FIG. 5 also displays the excess power, or power headroom, as the difference between the combined power usage and the group power consumption values. Excess power can be dynamically distributed among the devices in the group based on the priority of each device as well on the power consumption values, with the higher-priority devices with more power consumption receiving more power.

At interval 1, the excess power of the group is 700 W. At interval 2, the power caps are adjusted accordingly. For example, if device 1 and device 2 are higher priority, they can be allocated relatively larger percentage increases of their previous measured power consumption, while if device 3 and device 4 are lower priority, they can be allocated relatively smaller percentage increases of their previous measured power consumption.

In an example application of the power determinations according to this disclosure, which can be understood by reference to FIG. 5, consider a group of five devices, D1, D2, D3, D4, and D5. The devices are divided into three priority classes, high, medium, and low. Devices D1 and D2 are high priority, devices D3 and D4 are medium priority, and device D5 is low priority. The priority weights are 3 for high, 2 for medium, and 1 for low. The group power limit is 2000 W.

At a first time T1, the power headroom is measured at 700 W. In order to determine power limits for the devices, first, the equation set forth above for use by the priority class apportioner 210 can be applied to determine portions of power for each priority class, as follows:

Portion for high priority class=(700*3*2)/(3*2+2*2+ 1*1)=382 W (Approx.)

Portion for medium priority class=(700*2*2)/(3*2+ 2*2+1*1)=255 W (Approx.)

Portion for low priority class=(700*1*1)/(3*2+2*2+ 1*1)=64 W (Approx.)

Next, the equation set forth above for use by the device power allocator 212 can be applied to determine adjustments to the power consumption limits of each device, as follows:

Power cap adjustment for D1=(382/600)*250=159 W (Approx.)

Power cap adjustment for D2=(382/600)*350=223 W (Approx.)

Power cap adjustment for D3=(255/500)*300=153 W (Approx.)

Power cap adjustment for D4=(255/500)*200=102 W (Approx.)

Power cap adjustment for D5=(64/200)*200=64 W (Approx.)

The above calculated adjustment values can be combined with the measured power consumptions of each device to determine new allocations/power limits for each device. FIG. 5 shows (approximately) the result of application of the above adjustment values to calculate the power limits in the limit 2 column.

At a second time T2, the power headroom is measured at 300 W. In order to determine new power limits for the devices, first, the equation set forth above for use by the priority class apportioner 210 can again be applied to determine portions of power for each priority class, as follows:

Portion for high priority class=(300*3*2)/(3*2+2*2+ 1*1)=164 W (Approx.)

Portion for medium priority class=(300*2*2)/(3*2+ 2*2+1*1)=109 W (Approx.)

Portion for low priority class=(300*1*1)/(3*2+2*2+ 1*1)=27 W (Approx.)

Next, the equation set forth above for use by the device power allocator 212 can again be applied to determine adjustments to the power consumption limits of each device, as follows:

Power cap adjustment for D1=(164/900)*400=73 W (Approx.)

Power cap adjustment for D2=(164/900)*500=91 W (Approx.)

Power cap adjustment for D3=(109/627)*427=74 W (Approx.)

Power cap adjustment for D4=(109/627)*200=35 W (Approx.)

Power cap adjustment for D5=(27/173)*173=27 W (Approx.)

The above calculated adjustment values can be again be combined with the measured power consumptions of each device (this time, the values in the IPC2 column) to determine new allocations/power limits for each device. FIG. 5 shows (approximately) the result of application of the above adjustment values to calculate the power limits in the limit 3 column.

Figure 6:
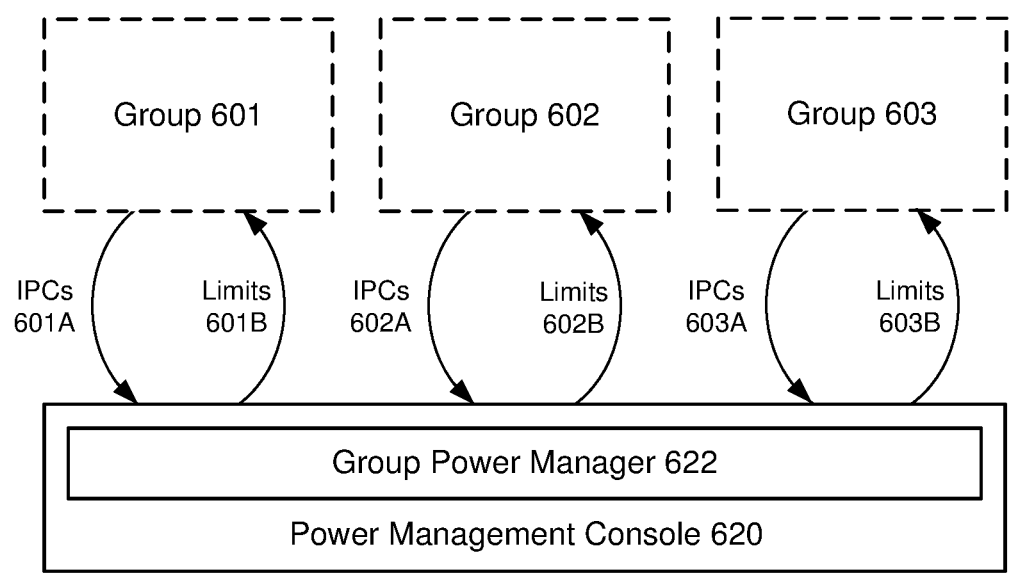
FIG. 6 illustrates an example power management console equipped with a group power manager configured to manage multiple different groups of devices, in accordance with one or more embodiments described herein.

FIG. 6 illustrates an example power management console equipped with a group power manager configured to manage multiple different groups of devices, in accordance with one or more embodiments described herein. The example power management console 620 includes a group power manager 622, and the power management console 620 and group power manager 622 can implement the power management console 120 and group power manager 122 introduced in FIG. 1. FIG. 6 furthermore illustrates group 601, group 602, and group 603. Each of the groups 601, 602, 603 can comprise a group of devices, similar to the group 100 illustrated in FIG. 1. For example, each of the groups 601, 602, 603 can optionally comprise a different rack of server devices in a data center. The groups 601, 602, 603 can optionally contain different numbers of devices, different types of devices, different numbers of priority classes, and/or different group power limits.

FIG. 6 illustrates management of multiple different groups 601, 602, 603 by the group power manager 622. Each group can provide IPC information to the group power manager 622, and the group power manager 622 can use optionally different group power limit information and device priority class information applicable to each to each group 601, 602, or 603 to determine power limits for devices in the group 601, 602, or 603. For example, the group power manager 622 can receive IPCs 601A from the devices of group 601, and the group power manager 622 can determine limits 601B for the devices of group 601. The group power manager 622 can receive IPCs 602A from the devices of group 602, and the group power manager 622 can determine limits 602B for the devices of group 602. The group power manager 622 can receive IPCs 603A from the devices of group 603, and the group power manager 622 can determine limits 603B for the devices of group 603. The group power manager 622 can repeat determinations of limits 601B, 602B, and 603B optionally according to different schedules for the different groups 601, 602, 603.

Figure 7:
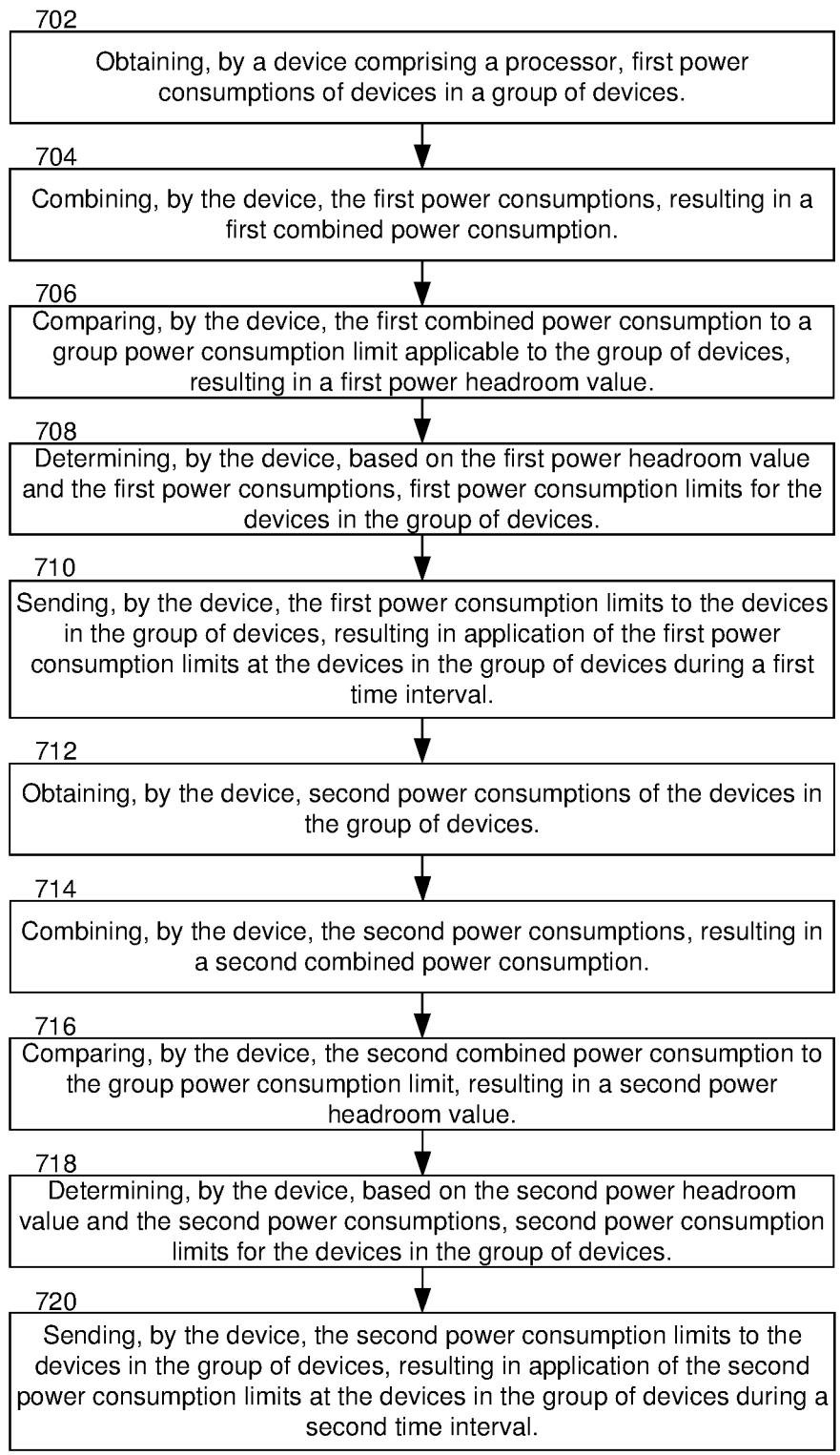
FIG. 7 is a flow diagram of an example, non-limiting computer implemented method that can be performed by device comprising a group power manager, in accordance with one or more embodiments described herein.

FIG. 7 is a flow diagram of an example, non-limiting computer implemented method that can be performed by device comprising a group power manager, in accordance with one or more embodiments described herein. The blocks of the illustrated method represent operations according to a method, components in one or more computing devices, and/or computer executable instructions in a computer readable storage medium, as can be appreciated. While the operations are illustrated in sequence, it can furthermore be appreciated that certain operations can optionally be re-ordered, combined, removed or supplemented with other operations in some embodiments.

In an embodiment, the method illustrated in FIG. 7 can be performed by a power management console 120 equipped with a group power manager 122, such as illustrated in FIG. 1. Operation 702 comprises obtaining, by a device comprising a processor, such as the power management console 120, first power consumptions, such as first instances of IPCs 101B, 102B, 103B of devices 101, 102, 103 in a group of devices 100. The devices 101, 102, 103 in the group of devices 100 can comprise, e.g., servers in a rack of servers.

Operation 704 comprises combining, by the device 120, the first power consumptions 101B, 102B, 103B, resulting in a first combined power consumption. The combining can be a simple addition of first power consumptions 101B, 102B, 103B or potentially another mathematical combination. Operation 706 comprises comparing, by the device 120, the first combined power consumption to a group power consumption limit 115 applicable to the group of devices 100, resulting in a first power headroom value. The group power consumption limit 115 can comprise, e.g., a power distribution unit limit of a power distribution unit 110 that supplies power to the devices 101, 102, 103 in the group of devices 100.

Operation 708 comprises determining, by the device 120, based on the first power headroom value and the first power consumptions, first power consumption limits, e.g., first instances of power limits 101C, 102C, 103C for the devices 101, 102, 103 in the group of devices 100.

In some embodiments, operation 708 can comprise operations of the priority class apportioner 201 and/or the device power allocator 212, described herein with reference to FIG. 2. For example, the devices 101, 102, 103 in the group of devices 100 can comprise first devices in a first priority class, such as class A in FIG. 3, and second devices in a second priority class, such as class B in FIG. 3. Determining the first power consumption limits 101C, 102C, 103C can comprise determining a first portion of the first power headroom value for allocation to the first devices, and determining a second portion of the first power headroom value for allocation to the second devices. The first and second portions of the power headroom value can optionally be added to previous device consumption values to determine portions of overall available power for assignment to devices of a priority class.

Furthermore, determining the first power consumption limits 101C, 102C, 103C can comprise determining allocations of the first portion to the first devices based on power consumptions of the first devices, and allocations of the second portion to the second devices based on power consumptions of the second devices. Such allocations, e.g. the allocations illustrated in FIG. 3, can be determined as power headroom adjustment allocations or as allocations of portions of overall available power, depending on the desired approach.

Operation 710 comprises sending, by the device 120, the first power consumption limits 101C, 102C, 103C to the devices 101, 102, 103 in the group of devices 100, resulting in application of the first power consumption limits 101C, 102C, 103C at the devices 101, 102, 103 in the group of devices 100 during a first time interval. The duration of the first time interval can depend on, e.g. a rate of change in device power demand of devices 101, 102, 103. The first time interval can comprise a duration from, for example, one millisecond to five minutes.

Operations 712-720 are illustrated as an example repetition of operations 702-710, at a subsequent second time interval. Operations 712-720 can be performed subsequent to the application of the first power consumption limits (first instances of 101C, 102C, 103C) at the devices 101, 102, 103 in the group of devices 100 during the first time interval. Operation 712 comprises obtaining, by the device 120, second power consumptions, e.g. second instances of IPCs 101B, 102B, 103B of the devices 101, 102, 103 in the group of devices 100. Operation 714 comprises combining, by the device 120, the second power consumptions 101B, 102B, 103B, resulting in a second combined power consumption. Operation 716 comprises comparing, by the device 120, the second combined power consumption to the group power consumption limit 115, resulting in a second power headroom value. Operation 718 comprises determining, by the device 120, based on the second power headroom value and the second power consumptions, second power consumption limits, e.g., second instances of power limits 101C, 102C, 103C for the devices 101, 102, 103 in the group of devices 100. Operation 720 comprises sending, by the device 120, the second power consumption limits 101C, 102C, 103C to the devices 101, 102, 103 in the group of devices 100, resulting in application of the second power consumption limits 101C, 102C, 103C at the devices 101, 102, 103 in the group of devices 100 during the second time interval. Further repetitions of the operations 712-720 can be performed indefinitely for further subsequent time intervals.

Figure 8:
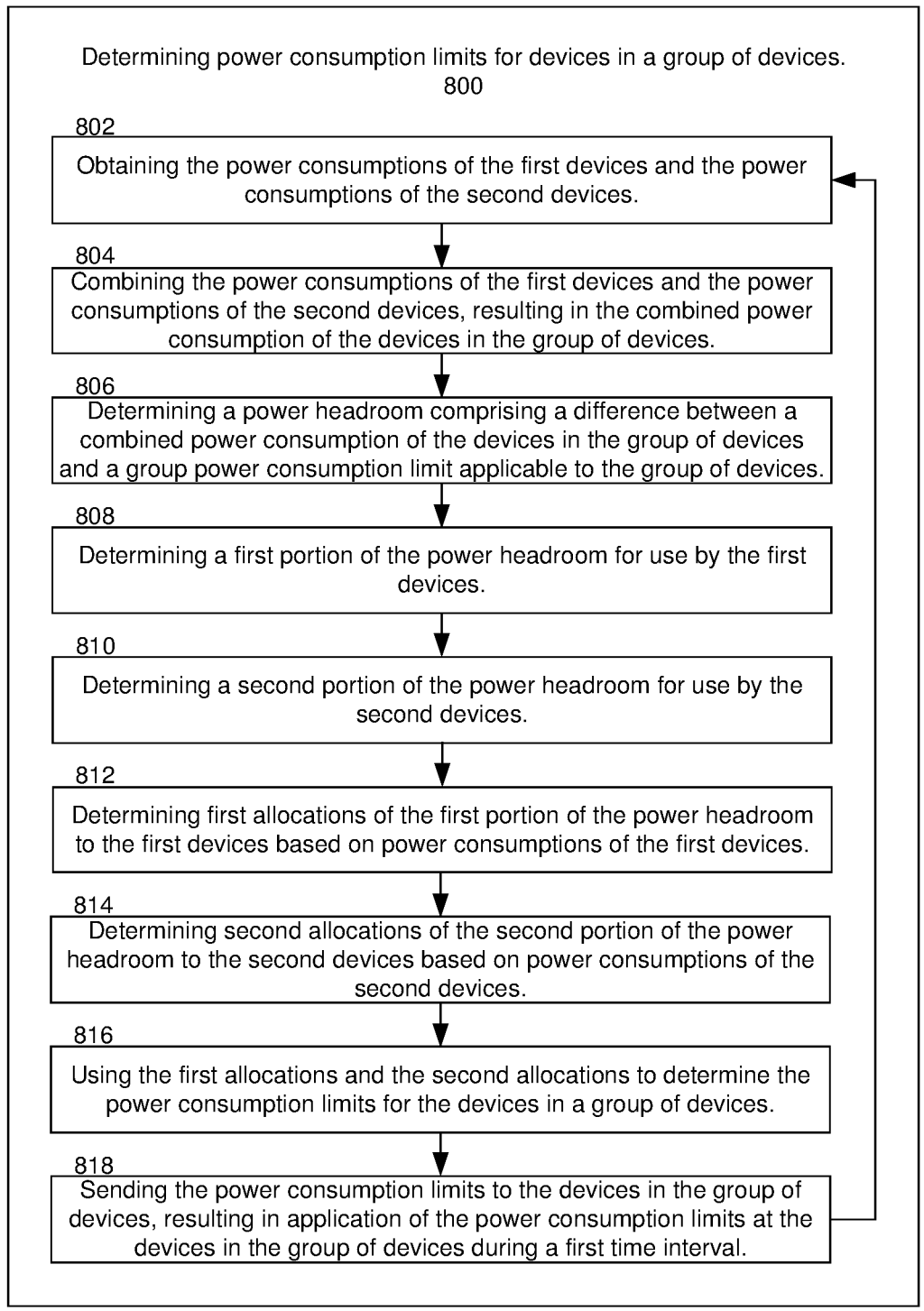
FIG. 8 is a flow diagram of another example, non-limiting computer implemented method that can be performed by a device comprising a group power manager, in accordance with one or more embodiments described herein.

FIG. 8 is a flow diagram of another example, non-limiting computer implemented method that can be performed by a device comprising a group power manager, in accordance with one or more embodiments described herein. The blocks of the illustrated method represent operations according to a method, components in one or more computing devices, and/or computer executable instructions in a computer readable storage medium, as can be appreciated. While the operations are illustrated in sequence, it can furthermore be appreciated that certain operations can optionally be re-ordered, combined, removed or supplemented with other operations in some embodiments.

In an embodiment, the method illustrated in FIG. 8 can be performed by a power management console 120 equipped with a group power manager 122, such as illustrated in FIG. 1. Example operation 800 comprises determining power consumption limits, e.g., power limits 101C, 102C, 103C, for devices 101, 102, 103 in the group of devices 100. The devices 101, 102, 103 in the group of devices 100 can comprise, e.g., first devices in a first priority class and second devices in a second priority class, e.g. priority classes similar to those illustrated in FIG. 3. Determining the power consumption limits 101C, 102C, 103C can comprise operations 802-818, which can be repeated at each of multiple time intervals.

Example operation 802 comprises obtaining power consumptions, e.g., IPCs 101B, 102B, 103B of the first devices, e.g., devices of a priority class A, and power consumptions of the second devices, e.g., devices of a priority class B. Example operation 804 comprises combining the power consumptions of the first devices and the power consumptions of the second devices, resulting in the combined power consumption of the devices 101, 102, 103 in the group of devices 100.

Example operation 806 comprises determining a power headroom comprising a difference between a combined power consumption of the devices 101, 102, 103 in the group of devices 100, as determined at 804, and a group power consumption limit 115 applicable to the group of devices 100. The group power consumption limit 115 can comprise, e.g., a power distribution unit limit of a power distribution unit 110 that supplies power to the devices 101, 102, 103 in the group of devices 100.

Example operation 808 comprises determining a first portion of the power headroom for use by the first devices, and example operation 810 comprises determining a second portion of the power headroom for use by the second devices. For example, power adjustment values applicable to the various priority classes can be determined as described in connection with FIG. 2.

Example operation 812 comprises determining first allocations of the first portion of the power headroom to the first devices based on power consumptions of the first devices, and example operation 814 comprises determining second allocations of the second portion of the power headroom to the second devices based on power consumptions of the second devices. Operations 812 and 814 can be understood by reference to FIG. 3. In some embodiments, power headroom can optionally be allocated by first determining portions of overall available power (in contrast with power headroom portions) for each priority class, and then allocating the portions of overall available power to devices in each priority class based on the individual power consumptions of the devices. In other embodiments, power headroom portions can be allocated to devices, based on the individual power consumptions of the devices, and example operation 816 can comprise using the resulting first allocations and the second allocations to determine the power consumption limits 101C, 102C, 103C for the devices 101, 102, 103 in the group of devices 100. Using the first allocations and the second allocations to determine the power consumption limits 101C, 102C, 103C can comprise, e.g., adding headroom allocations to prior device power consumption values 101B, 102B, 103B to determine the power consumption limits 101C, 102C, 103C.

Example operation 818 comprises sending the power consumption limits 101C, 102C, 103C to the devices 101, 102, 103 in the group of devices 100, resulting in application of the power consumption limits 101C, 102C, 103C at the devices 101, 102, 103 in the group of devices 100 during a first time interval.

The operations 802-818 can be repeated, optionally periodically, at subsequent time intervals. For example, the power consumption limits 101C, 102C, 103C can comprise first power consumption limits, and the operations 802-818 can be repeated, resulting in second power consumption limits (second instances of 101C, 102C, 103C) being determined and sent to the devices 101, 102, 103 in the group of devices 100, resulting in application of the second power consumption limits at the devices 101, 102, 103 in the group of devices 100 during a second time interval. The first time interval and the second time interval can comprise, e.g., durations in a range from one millisecond to five minutes.

Figure 9:
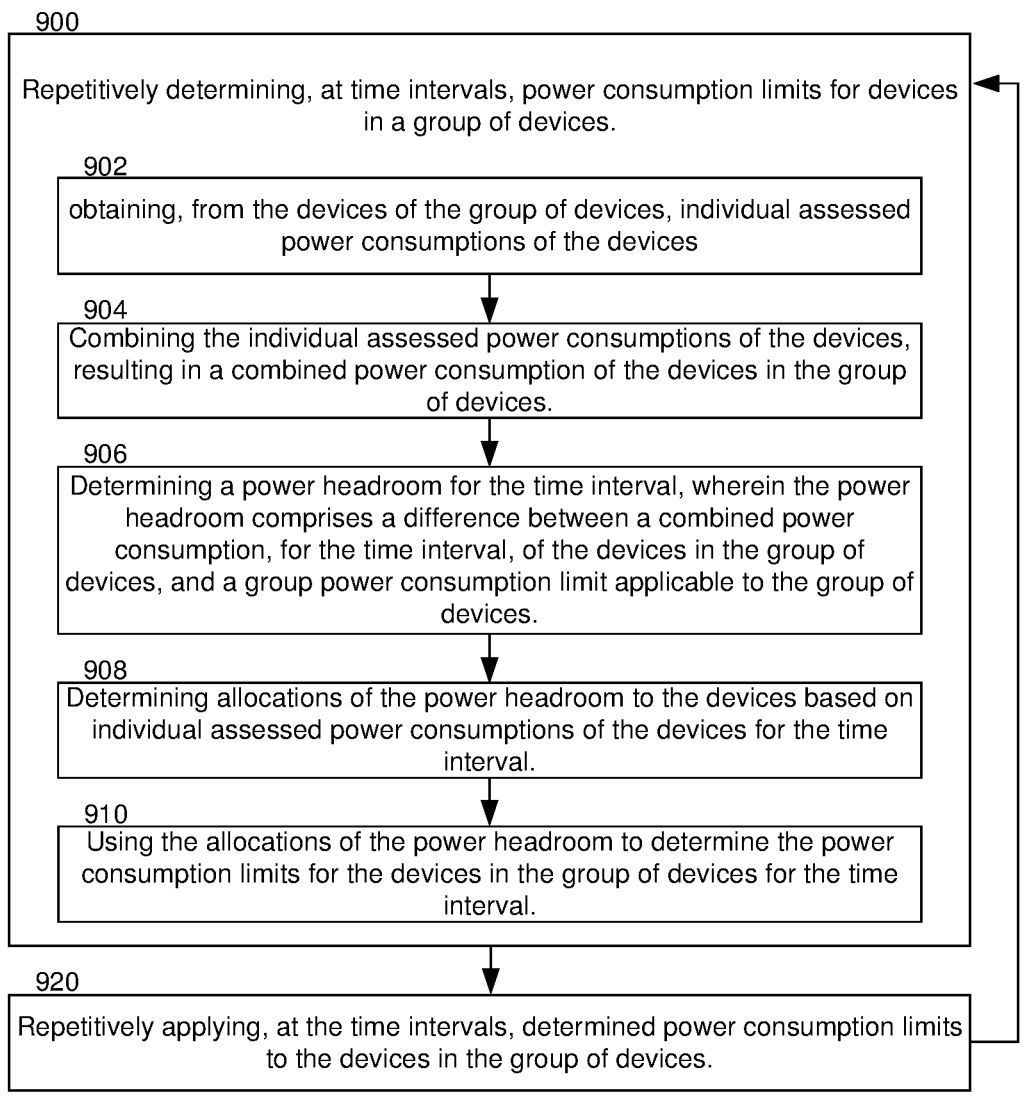
FIG. 9 is a flow diagram of another example, non-limiting computer implemented method that can be performed by device comprising a group power manager, in accordance with one or more embodiments described herein.

FIG. 9 is a flow diagram of another example, non-limiting computer implemented method that can be performed by device comprising a group power manager, in accordance with one or more embodiments described herein. The blocks of the illustrated method represent operations according to a method, components in one or more computing devices, and/or computer executable instructions in a computer readable storage medium, as can be appreciated. While the operations are illustrated in sequence, it can furthermore be appreciated that certain operations can optionally be re-ordered, combined, removed or supplemented with other operations in some embodiments.

In an embodiment, the method illustrated in FIG. 9 can be performed by a power management console 120 equipped with a group power manager 122, such as illustrated in FIG. 1. Example operation 900 comprises repetitively determining, at time intervals, power consumption limits, e.g., power limits 101C, 102C, 103C, for devices 101, 102, 103 in a group of devices 100. Example operation 900 includes operations 902-910, which can be repeated each time operation 900 is repeated. Example operation 920 includes repetitively applying, at the time intervals, determined power consumption limits 101C, 102C, 103C to the devices 101, 102, 103 in the group of devices 100. Each iteration of operation 900 can determine power consumption limits 101C, 102C, 103C, and the power consumption limits 101C, 102C, 103C can be applied at a corresponding iteration of operation 920.

The operations 902-910 included in each iteration of operation 900 can each be performed for a time interval. Example operation 902 comprises obtaining, from the devices 101, 102, 103 in the group of devices 100, individual assessed power consumptions, e.g., IPCs 101B, 102B, 103B of the devices 101, 102, 103. Example operation 904 comprises combining the individual assessed power consumptions 101B, 102B, 103B of the devices 101, 102, 103, resulting in a combined power consumption of the devices 101, 102, 103 in the group of devices 100. Example operation 906 comprises determining a power headroom for the time interval, wherein the power headroom comprises a difference between a combined power consumption, for the time interval, of the devices 101, 102, 103 in the group of devices 100, as determined at operation 902, and a group power consumption limit 115 applicable to the group of devices 100. The group power consumption limit 115 can comprise, e.g., a power distribution unit limit.

Example operation 908 comprises determining allocations of the power headroom to the devices 101, 102, 103 based on individual assessed power consumptions e.g., IPCs 101B, 102B, 103B of the devices 101, 102, 103 for the time interval, and example operation 910 comprises using the allocations of the power headroom to determine the power consumption limits 101C, 102C, 103C for the devices 101, 102, 103 in the group of devices 100 for the time interval.

Determining the power consumption limits 101C, 102C, 103C for the time interval can further comprise, e.g., operations described herein in connection with priority class apportioner 210 and device power allocator 212. The priority class apportioner 210 can determine portions of the power headroom for use by different classes of devices, e.g., a first portion of the power headroom for use by first devices of the group of devices 100, and a second portion of the power headroom for use by second devices of the group of devices 100. The device power allocator 212 can determine allocations of the power headroom to the devices for example by determining first allocations of the first portion of the power headroom for use by the first devices, and determining second allocations of the second portion of the power headroom for use by the second devices.

Figure 10:
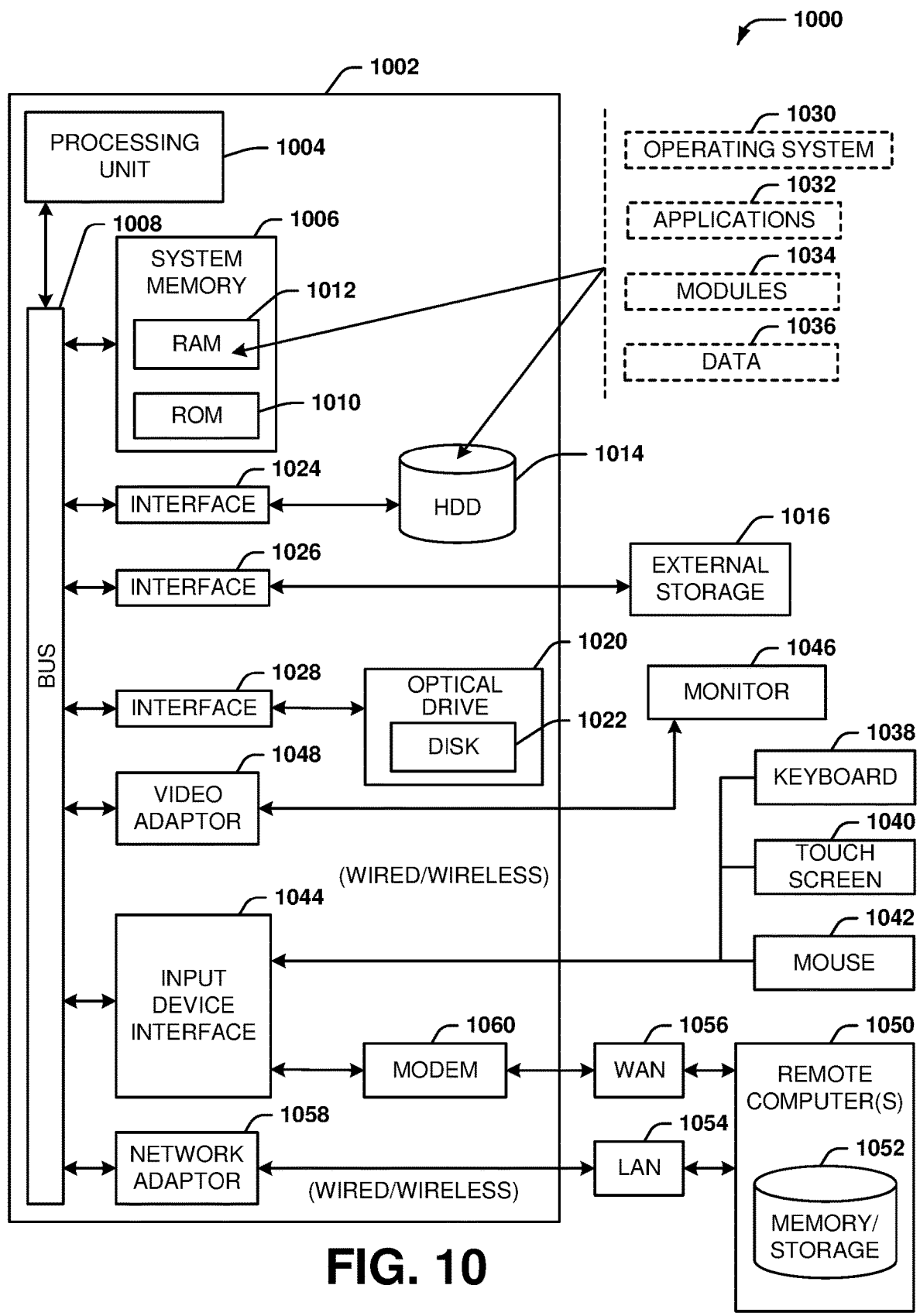
FIG. 10 illustrates a block diagram of an example computer operable to provide any of the various devices described herein.

In order to provide additional context for various embodiments described herein, FIG. 10 and the following discussion are intended to provide a brief, general description of a suitable computing environment 1000 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the methods can be practiced with other computer system configurations, including single-processor or multiprocessor computer systems, minicomputers, mainframe computers, IoT devices, distributed computing systems, as well as personal computers, hand-held computing devices, microprocessor-based or programmable consumer electronics, and the like, each of which can be operatively coupled to one or more associated devices.

The embodiments illustrated herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 10, the example environment 1000 for implementing various embodiments of the aspects described herein includes a computer 1002, the computer 1002 including a processing unit 1004, a system memory 1006 and a system bus 1008. The system bus 1008 couples system components including, but not limited to, the system memory 1006 to the processing unit 1004. The processing unit 1004 can be any of various commercially available processors and may include a cache memory. Dual microprocessors and other multi-processor architectures can also be employed as the processing unit 1004.

The system bus 1008 can be any of several types of bus structure that can further interconnect to a memory bus (with or without a memory controller), a peripheral bus, and a local bus using any of a variety of commercially available bus architectures. The system memory 1006 includes ROM 1010 and RAM 1012. A basic input/output system (BIOS) can be stored in a non-volatile memory such as ROM, erasable programmable read only memory (EPROM), EEPROM, which BIOS contains the basic routines that help to transfer information between elements within the computer 1002, such as during startup. The RAM 1012 can also include a high-speed RAM such as static RAM for caching data.

The computer 1002 further includes an internal hard disk drive (HDD) 1014 (e.g., EIDE, SATA), one or more external storage devices 1016 (e.g., a magnetic floppy disk drive (FDD) 1016, a memory stick or flash drive reader, a memory card reader, etc.) and an optical disk drive 1020 (e.g., which can read or write from a CD-ROM disc, a DVD, a BD, etc.). While the internal HDD 1014 is illustrated as located within the computer 1002, the internal HDD 1014 can also be configured for external use in a suitable chassis (not shown). Additionally, while not shown in environment 1000, a solid state drive (SSD) could be used in addition to, or in place of, an HDD 1014. The HDD 1014, external storage device(s) 1016 and optical disk drive 1020 can be connected to the system bus 1008 by an HDD interface 1024, an external storage interface 1026 and an optical drive interface 1028, respectively. The interface 1024 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1002, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. The systems and methods described herein can be implemented utilizing various commercially available operating systems or combinations of operating systems.

Computer 1002 can optionally comprise emulation technologies. For example, a hypervisor (not shown) or other intermediary can emulate a hardware environment for operating system 1030, and the emulated hardware can optionally be different from the hardware illustrated in FIG. 10. In such an embodiment, operating system 1030 can comprise one virtual machine (VM) of multiple VMs hosted at computer 1002. Furthermore, operating system 1030 can provide runtime environments, such as the Java runtime environment or the .NET framework, for applications 1032. Runtime environments are consistent execution environments that allow applications 1032 to run on any operating system that includes the runtime environment. Similarly, operating system 1030 can support containers, and applications 1032 can be in the form of containers, which are lightweight, standalone, executable packages of software that include, e.g., code, runtime, system tools, system libraries and settings for an application.

Further, computer 1002 can comprise a security module, such as a trusted processing module (TPM). For instance with a TPM, boot components hash next in time boot components, and wait for a match of results to secured values, before loading a next boot component. This process can take place at any layer in the code execution stack of computer 1002, e.g., applied at the application execution level or at the operating system (OS) kernel level, thereby enabling security at any level of code execution.

A user can enter commands and information into the computer 1002 through one or more wired/wireless input devices, e.g., a keyboard 1038, a touch screen 1040, and a pointing device, such as a mouse 1042. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1004 through an input device interface 1044 that can be coupled to the system bus 1008, but can be connected by other interfaces, such as a parallel port, an IEEE 1394 serial port, a game port, a USB port, an IR interface, a BLUETOOTH® interface, etc.

A monitor 1046 or other type of display device can be also connected to the system bus 1008 via an interface, such as a video adapter 1048. In addition to the monitor 1046, a computer typically includes other peripheral output devices (not shown), such as speakers, printers, etc.

The computer 1002 can operate in a networked environment using logical connections via wired and/or wireless communications to one or more remote computers, such as a remote computer(s) 1050. The remote computer(s) 1050 can be a workstation, a server computer, a router, a personal computer, portable computer, microprocessor-based entertainment appliance, a peer device or other common network node, and typically includes many or all of the elements described relative to the computer 1002, although, for purposes of brevity, only a memory/storage device 1052 is illustrated. The logical connections depicted include wired/wireless connectivity to a local area network (LAN) 1054 and/or larger networks, e.g., a wide area network (WAN) 1056. Such LAN and WAN networking environments are commonplace in offices and companies, and facilitate enterprise-wide computer networks, such as intranets, all of which can connect to a global communications network, e.g., the internet.

When used in a LAN networking environment, the computer 1002 can be connected to the local network 1054 through a wired and/or wireless communication network interface or adapter 1058. The adapter 1058 can facilitate wired or wireless communication to the LAN 1054, which can also include a wireless access point (AP) disposed thereon for communicating with the adapter 1058 in a wireless mode.

When used in a WAN networking environment, the computer 1002 can include a modem 1060 or can be connected to a communications server on the WAN 1056 via other means for establishing communications over the WAN 1056, such as by way of the internet. The modem 1060, which can be internal or external and a wired or wireless device, can be connected to the system bus 1008 via the input device interface 1044. In a networked environment, program modules depicted relative to the computer 1002 or portions thereof, can be stored in the remote memory/storage device 1052. It will be appreciated that the network connections shown are example and other means of establishing a communications link between the computers can be used.

When used in either a LAN or WAN networking environment, the computer 1002 can access cloud storage systems or other network-based storage systems in addition to, or in place of, external storage devices 1016 as described above. Generally, a connection between the computer 1002 and a cloud storage system can be established over a LAN 1054 or WAN 1056 e.g., by the adapter 1058 or modem 1060, respectively. Upon connecting the computer 1002 to an associated cloud storage system, the external storage interface 1026 can, with the aid of the adapter 1058 and/or modem 1060, manage storage provided by the cloud storage system as it would other types of external storage. For instance, the external storage interface 1026 can be configured to provide access to cloud storage sources as if those sources were physically connected to the computer 1002.

The computer 1002 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

The above description includes non-limiting examples of the various embodiments. It is, of course, not possible to describe every conceivable combination of components or methodologies for purposes of describing the disclosed subject matter, and one skilled in the art may recognize that further combinations and permutations of the various embodiments are possible. The disclosed subject matter is intended to embrace all such alterations, modifications, and variations that fall within the spirit and scope of the appended claims.

With regard to the various functions performed by the above described components, devices, circuits, systems, etc., the terms (including a reference to a "means") used to describe such components are intended to also include, unless otherwise indicated, any structure(s) which performs the specified function of the described component (e.g., a functional equivalent), even if not structurally equivalent to the disclosed structure. In addition, while a particular feature of the disclosed subject matter may have been disclosed with respect to only one of several implementations, such feature may be combined with one or more other features of the other implementations as may be desired and advantageous for any given or particular application.

The terms "exemplary" and/or "demonstrative" as used herein are intended to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent structures and techniques known to one skilled in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

The term "or" as used herein is intended to mean an inclusive "or" rather than an exclusive "or." For example, the phrase "A or B" is intended to include instances of A, B, and both A and B. Additionally, the articles "a" and "an" as used in this application and the appended claims should generally be construed to mean "one or more" unless either otherwise specified or clear from the context to be directed to a singular form.

The term "set" as employed herein excludes the empty set, i.e., the set with no elements therein. Thus, a "set" in the subject disclosure includes one or more elements or entities. Likewise, the term "group" as utilized herein refers to a collection of one or more entities.

The terms "first," "second," "third," and so forth, as used in the claims, unless otherwise clear by context, is for clarity only and doesn't otherwise indicate or imply any order in time. For instance, "a first determination," "a second determination," and "a third determination," does not indicate or imply that the first determination is to be made before the second determination, or vice versa, etc.

The description of illustrated embodiments of the subject disclosure as provided herein, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as one skilled in the art can recognize. In this regard, while the subject matter has been described herein in connection with various embodiments and corresponding drawings, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A method, comprising:
    measuring, by a device comprising a processor, first power consumptions of devices in a group of devices;
    combining, by the device, the first power consumptions, resulting in a first combined power consumption;
    comparing, by the device, the first combined power consumption to a group power consumption limit applicable to the group of devices, resulting in a first power headroom value;
    determining, by the device, based on the first power headroom value and the first power consumptions, first power consumption limits for the devices in the group of devices, wherein the devices in the group of devices comprise first devices of a first priority class and second devices of a second priority class, and wherein determining the first power consumption limits comprises:
        determining a first portion of the first power headroom value for allocation to the first devices, and determining a second portion of the first power headroom value for allocation to the second devices, and
        determining the allocation of the first portion to the first devices based on a consolidated power cap to be adjusted among the first devices of the first priority class, a total combined power consumption of the devices of the first priority class, and power consumptions of the first devices; and
    applying, by the device, the first power consumption limits at the devices in the group of devices during a first time interval.

2. The method of claim 1, further comprising, subsequent to the application of the first power consumption limits at the devices in the group of devices during the first time interval:
    obtaining, by the device, second power consumptions of the devices in the group of devices;
    combining, by the device, the second power consumptions, resulting in a second combined power consumption;
    comparing, by the device, the second combined power consumption to the group power consumption limit, resulting in a second power headroom value;
    determining, by the device, based on the second power headroom value and the second power consumptions, second power consumption limits for the devices in the group of devices; and
    sending, by the device, the second power consumption limits to the devices in the group of devices, resulting in application of the second power consumption limits at the devices in the group of devices during a second time interval.

3. The method of claim 1, wherein the devices in the group of devices comprise servers in a rack of servers.

4. The method of claim 1, wherein the group power consumption limit comprises a power distribution unit limit of a power distribution unit that supplies power to the devices in the group of devices.

5. The method of claim 1, wherein the first time interval comprises a duration from one millisecond to five minutes.

6. The method of claim 1, wherein the first consolidated power cap that is adjustable among the first devices associated with the first priority class is based on a weighted value associated with the first priority class.

7. A device, comprising:
    a processor; and
    a memory that stores executable instructions that, when executed by the processor, facilitate performance of operations, the operations comprising:
        determining power consumption limits for devices in a group of devices, wherein the devices in the group of devices comprise first devices in a first priority class and second devices in a second priority class, and wherein determining the power consumption limits comprises:
  determining a power headroom comprising a difference between a combined power consumption of the devices in the group of devices and a group power consumption limit applicable to the group of devices by measuring power consumptions of the devices;
  determining a first portion of the power headroom for use by the first devices;
  determining a second portion of the power headroom for use by the second devices;
  determining first allocations of the first portion of the power headroom to the first devices based on a first consolidated power cap to be adjusted among the first devices in the first priority class, and first power consumptions of the first devices;
  determining second allocations of the second portion of the power headroom to the second devices based on a second consolidated power cap to be adjusted among the second devices in the second priority class, a total combined power consumption of the second devices in the second priority class, and second power consumptions of the second devices;
  using the first allocations and the second allocations to determine the power consumption limits for the devices in a group of devices; and
  applying the power consumption limits for the devices.

8. The device of claim 7, wherein the operations further comprise sending the power consumption limits to the devices in the group of devices, resulting in application of the power consumption limits at the devices in the group of devices during a first time interval.

9. The device of claim 8, wherein the power consumption limits comprise first power consumption limits, and wherein the operations further comprise repeating the determining power consumption limits for the devices in the group of devices, resulting in second power consumption limits, and sending the second power consumption limits to the devices in the group of devices, resulting in application of the second power consumption limits at the devices in the group of devices during a second time interval.

10. The device of claim 9, wherein the first time interval and the second time interval comprise a duration in a range from one millisecond to five minutes.

11. The device of claim 7, wherein the devices in the group of devices comprise devices in a rack of devices within a data center.

12. The device of claim 7, wherein the operations further comprise:
  obtaining the first power consumptions of the first devices and the second power consumptions of the second devices; and
  combining the first power consumptions of the first devices and the second power consumptions of the second devices, resulting in the combined power consumption of the devices in the group of devices.

13. The device of claim 7, wherein the group power consumption limit comprises a power distribution unit limit of a power distribution unit that supplies power to the devices in the group of devices.

14. The device of claim 7, wherein the first consolidated power cap that is adjustable among the first devices associated with the first priority class is based on a first weighted value associated with the first priority class and the second consolidated power cap that is adjustable among the second devices associated with the second priority class is based on a second weighted value associated with the second priority class.

15. A non-transitory machine-readable medium, comprising executable instructions that, when executed by a processor, facilitate performance of operations, the operations comprising:
  repetitively measuring, at time intervals, power consumption limits for devices in a group of devices, wherein determining the power consumption limits for a time interval of the time intervals comprises:
    determining a power headroom for the time interval, wherein the power headroom comprises a difference between a combined power consumption, for the time interval, of the devices in the group of devices, and a group power consumption limit applicable to the group of devices;
    determining a first portion of the power headroom for use by first devices of the group of devices associated with a first priority class;
    determining a second portion of the power headroom for use by second devices of the group of devices associated with a second priority class;
    determining first allocations of the first portion of the power headroom for use by the first devices based on a first consolidated power cap that is adjustable among the first devices associated with the first priority class, a first total combined power consumption of the first devices associated with the first priority class, and first individual assessed power consumptions of the first devices for the time interval;
    determining second allocations of the second portion of the power headroom for use by the second devices based on a second consolidated power cap that is adjustable among the second devices associated with the second priority class, a second total combined power consumption of the second devices associated with the second priority class, and second individual assessed power consumptions of the second devices for the time interval; and
    using the first allocations of the first portion of the power headroom and the second allocations of the second portion of the power headroom to determine the power consumption limits for the devices in the group of devices for the time interval.

16. The non-transitory machine-readable medium of claim 15, wherein the operations further comprise repetitively applying, at the time intervals, determined power consumption limits to the devices in the group of devices.

17. The non-transitory machine-readable medium of claim 15, wherein the devices in the group of devices comprise devices in a rack of devices connected to a power distribution unit, and wherein the group power consumption limit comprises a power distribution unit limit.

18. The non-transitory machine-readable medium of claim 15, wherein determining the power consumption limits for the time interval further comprises obtaining, from the devices of the group of devices, individual assessed power consumptions of the devices.

19. The non-transitory machine-readable medium of claim 18, wherein determining the power consumption limits for the time interval further comprises combining individual assessed power consumptions of the devices, resulting in the combined power consumption of the devices in the group of devices.

20. The non-transitory machine-readable medium of claim 15, wherein the first consolidated power cap that is adjustable among the first devices associated with the first priority class is based on a first weighted value associated with the first priority class and the second consolidated power cap that is adjustable among the second devices associated with the second priority class is based on a second weighted value associated with the second priority class.

\* \* \* \* \*